(12) United States Patent
Balakrishnan et al.

(10) Patent No.: US 9,735,176 B2
(45) Date of Patent: Aug. 15, 2017

(54) STACKED NANOWIRES WITH MULTI-THRESHOLD VOLTAGE SOLUTION FOR PFETS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/228,141

(22) Filed: Aug. 4, 2016

(65) Prior Publication Data
US 2017/0194357 A1    Jul. 6, 2017

Related U.S. Application Data

(62) Division of application No. 14/984,840, filed on Dec. 30, 2015, now Pat. No. 9,425,293.

(51) Int. Cl.
| H01L 27/12 | (2006.01) |
| H01L 29/10 | (2006.01) |
| H01L 29/06 | (2006.01) |
| H01L 21/308 | (2006.01) |
| H01L 29/423 | (2006.01) |
| H01L 27/088 | (2006.01) |

(Continued)

(52) U.S. Cl.
CPC ...... *H01L 27/1211* (2013.01); *H01L 21/3081* (2013.01); *H01L 27/0886* (2013.01); *H01L 29/0673* (2013.01); *H01L 29/1054* (2013.01); *H01L 29/165* (2013.01); *H01L 29/42392* (2013.01); *H01L 29/66818* (2013.01)

(58) Field of Classification Search
None
See application file for complete search history.

(56) References Cited

U.S. PATENT DOCUMENTS

| 8,063,450 B2 | 11/2011 | Wernersson et al. |
| 8,268,689 B2 | 9/2012 | Guo et al. |

(Continued)

OTHER PUBLICATIONS

Liao, Y. et al., "Multi-threshold design methodology of stacked Si-nanowire FETs", SOI-3D-Subthreshold Microelectronics Technology Unified Conference (S3S), IEEE, Oct. 2014, pp. 1-3.

*Primary Examiner* — William Coleman
*Assistant Examiner* — Kien Ly
(74) *Attorney, Agent, or Firm* — Scully, Scott, Murphy & Presser, P.C.; Louis J. Percello, Esq.

(57) ABSTRACT

A threshold voltage tuning approach for forming a stacked nanowire gate-all around pFET is provided. In the present application, selective condensation (i.e., oxidation) is used to provide a threshold voltage shift in silicon germanium alloy nanowires. The threshold voltage shift is well controlled because both underlying parameters which govern the final germanium content, i.e., nanowire width and amount of condensation, are well controlled by the selective condensation process. The present application can address the problem of width quantization in stacked nanowire FETs by offering various device options.

16 Claims, 14 Drawing Sheets

(51) Int. Cl.
*H01L 29/165* (2006.01)
*H01L 29/66* (2006.01)

(56) References Cited

U.S. PATENT DOCUMENTS

| | | | |
|---|---|---|---|
| 8,472,239 B2* | 6/2013 | Chang | B82Y 10/00 257/24 |
| 8,486,776 B2 | 7/2013 | Bedell et al. | |
| 8,659,006 B1 | 2/2014 | Chang et al. | |
| 9,318,573 B2 | 4/2016 | Moon et al. | |
| 2008/0135949 A1* | 6/2008 | Lo | B82Y 10/00 257/401 |
| 2009/0085027 A1 | 4/2009 | Jin et al. | |
| 2009/0090934 A1 | 4/2009 | Tezuka et al. | |
| 2010/0187503 A1 | 7/2010 | Moriyama et al. | |
| 2010/0207208 A1 | 8/2010 | Bedell et al. | |
| 2011/0018065 A1* | 1/2011 | Curatola | B82Y 10/00 257/368 |
| 2011/0059598 A1* | 3/2011 | Saracco | B82Y 10/00 438/479 |
| 2011/0147697 A1 | 6/2011 | Shah et al. | |
| 2011/0233522 A1 | 9/2011 | Cohen et al. | |
| 2014/0097502 A1 | 4/2014 | Sun et al. | |
| 2014/0131660 A1 | 5/2014 | Cea et al. | |
| 2014/0239254 A1 | 8/2014 | Bangsaruntip et al. | |
| 2014/0273423 A1 | 9/2014 | Fronheiser et al. | |
| 2015/0034899 A1 | 2/2015 | Ching et al. | |
| 2015/0035071 A1 | 2/2015 | Ching et al. | |
| 2015/0104918 A1* | 4/2015 | Liu | H01L 29/42392 438/283 |
| 2015/0243733 A1 | 8/2015 | Yang et al. | |
| 2015/0303303 A1 | 10/2015 | Lauer et al. | |
| 2015/0333167 A1 | 11/2015 | Leobandung | |
| 2015/0372119 A1 | 12/2015 | Zhang et al. | |
| 2016/0104799 A1 | 4/2016 | Qi et al. | |
| 2016/0268376 A1* | 9/2016 | Shih | H01L 29/0673 |

* cited by examiner

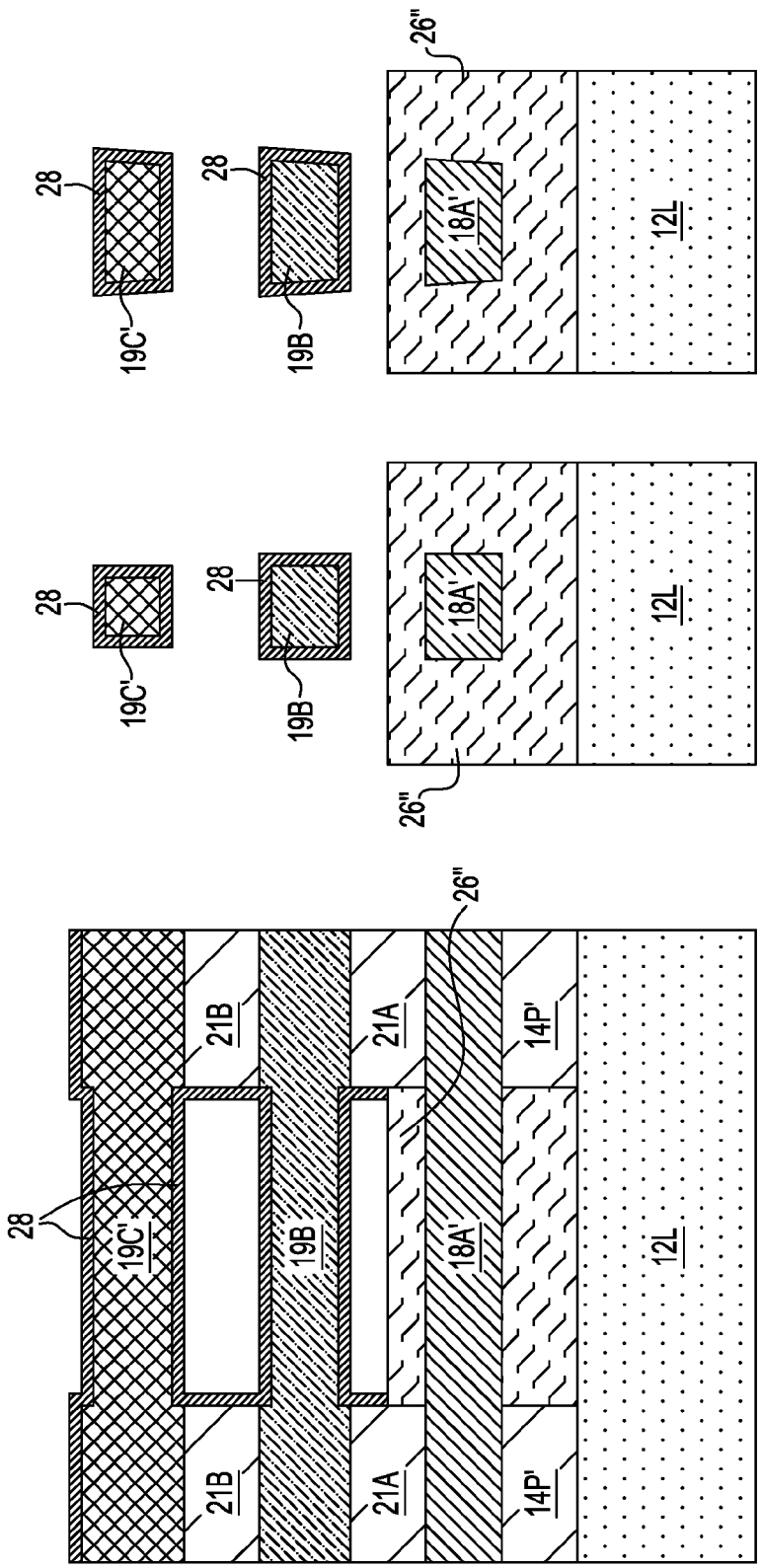

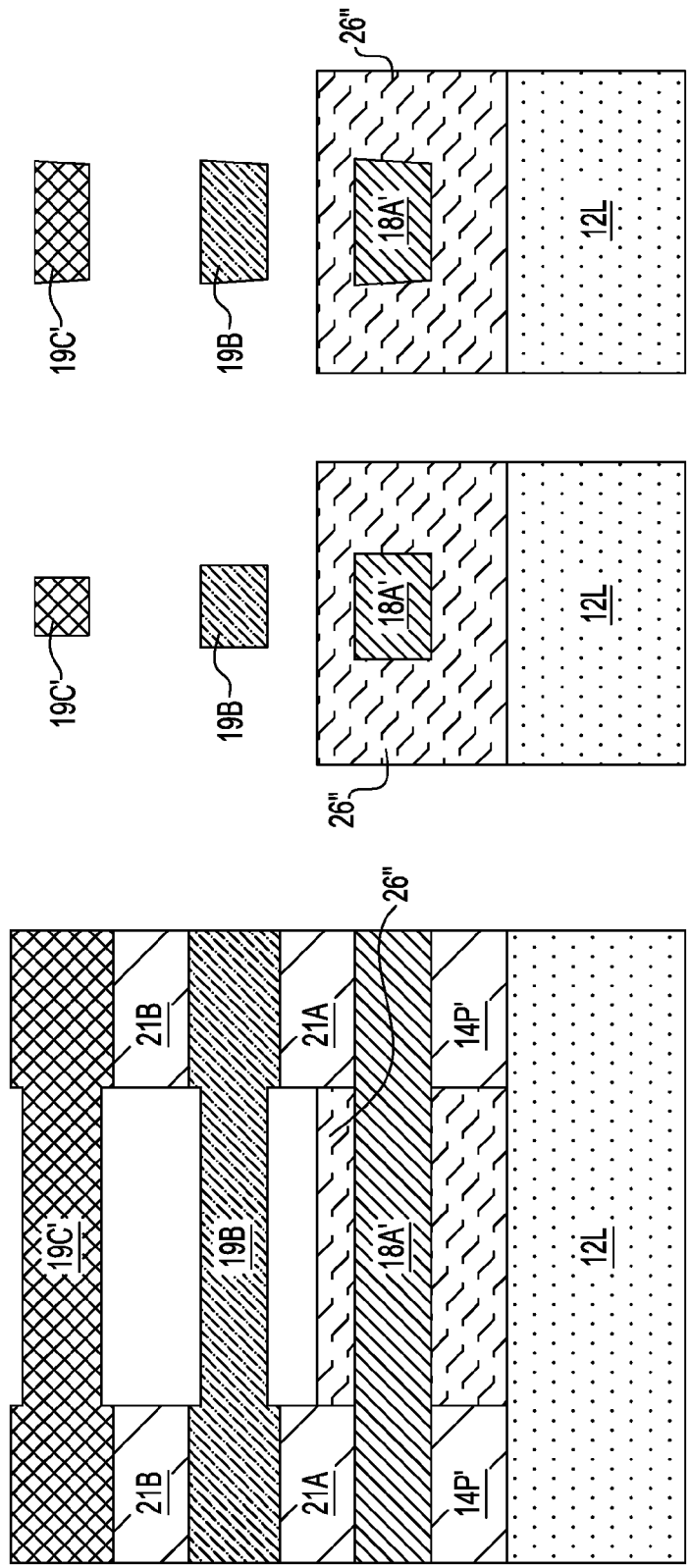

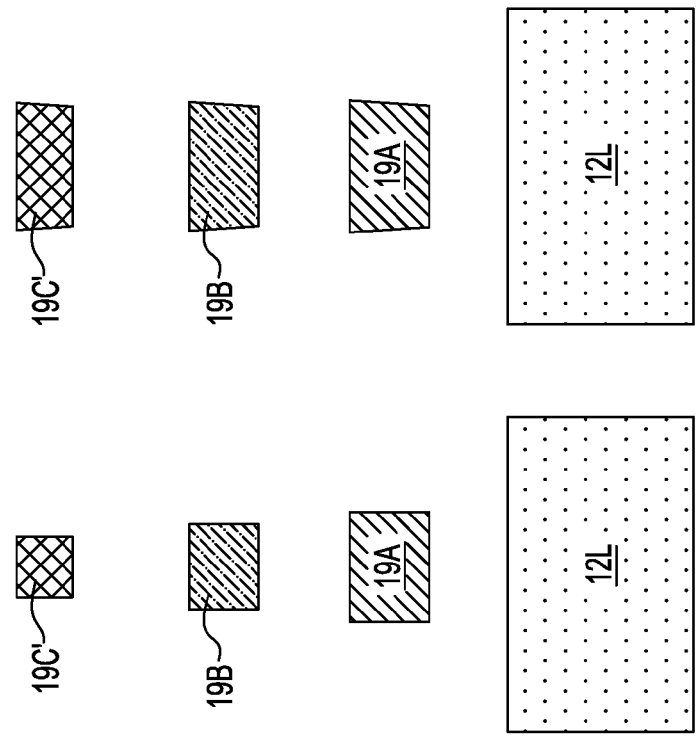
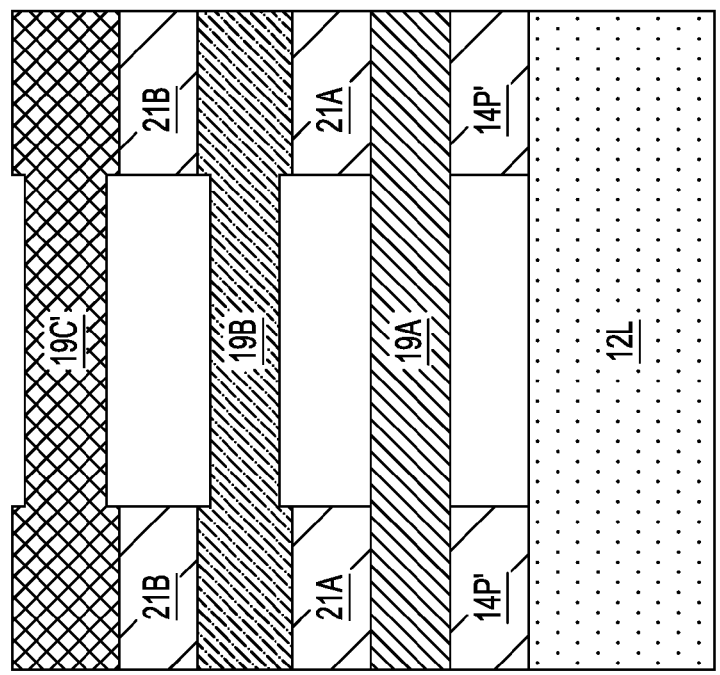
FIG. 12C
FIG. 12B
FIG. 12A

STACKED NANOWIRES WITH MULTI-THRESHOLD VOLTAGE SOLUTION FOR PFETS

BACKGROUND

The present application relates to semiconductor technology. More particularly, the present application relates to a semiconductor structure containing threshold voltage tuned vertically stacked silicon germanium alloy nanowires. The present application also provides a method of forming such a semiconductor structure.

The use of non-planar semiconductor devices such as, for example, FinFETs, trigate and gate-all around semiconductor nanowire field effect transistors (FETs) is the next step in the evolution of complementary metal oxide semiconductor (CMOS) devices. Such non-planar semiconductor devices can achieve higher drive currents with increasingly smaller dimensions as compared to conventional planar FETs.

Multiple threshold voltage options for non-planar devices are required to meet the wide variety of power-performance criteria required of microarchitectural circuit blocks. It is however difficult to obtain multiple threshold voltages in such non-planar devices due to the limited options such as, for example, using different work functional metals, which are available. In addition, device width quantization is more pronounced in stacked semiconductor nanowire devices which makes it difficult to select drive strength and threshold voltage together in a meaningful way.

In view of the above, there is a need for providing a multiple threshold voltage option for gate-all around stacked semiconductor nanowires which is capable of meeting the wide variety of power-performance criteria required of microarchitectural circuit blocks and which can circumvent the problem of width quantization.

SUMMARY

A threshold voltage tuning approach for forming a stacked nanowire gate-all around pFET is provided. In the present application, selective condensation (i.e., oxidation) is used to provide a threshold voltage shift in silicon germanium alloy nanowires. The threshold voltage shift is well controlled because both underlying parameters which govern the final germanium content, i.e., nanowire width and amount of condensation, are well controlled by the selective condensation process. The present application can address the problem of width quantization in stacked nanowire FETs by offering various device options.

In one aspect of the present application, a method of forming a semiconductor structure is provided. In one embodiment of the present application, the method may include providing a fin structure comprising, from bottom to top, a silicon portion and a multilayered stack of heterostructure portions. Each heterostructure portion includes, from bottom to top, a silicon germanium alloy portion having a first germanium content and a silicon portion, wherein each silicon germanium alloy portion of each heterostructure portion has a different thickness that increases from the bottommost heterostructure portion to the topmost heterostructure portion. Next, a middle segment of each silicon germanium alloy portion is suspended and thereafter an oxygen impermeable structure is formed atop the silicon germanium alloy portion of the topmost heterostructure portion and within a gap located beneath each silicon germanium alloy portion. The oxygen impermeable structure is then recessed below the silicon germanium alloy portion of the topmost heterostructure portion, while maintaining the oxygen impermeable structure on remaining silicon germanium alloy portions. The silicon germanium alloy portion of the topmost heterostructure portion is then oxidized to provide a topmost silicon germanium alloy nanowire having a reduced thickness and a second germanium content that is greater than the first germanium content. Surface oxide formed on the topmost silicon germanium alloy nanowire is thereafter after removed. The steps of recessing the oxygen impermeable structure, the oxidizing, and the removing the surface oxide on each remaining silicon germanium alloy portion of each heterostructure portion that is located above a bottommost silicon germanium alloy layer of the bottommost heterostructure portion can be repeated any number of times to provide a nanowire stack containing silicon germanium alloy nanowires, wherein the germanium content of each silicon germanium alloy nanowire of the nanowire stack increases from bottom to top.

In another aspect of the present application, a semiconductor structure is provided. In one embodiment of the present application, the semiconductor structure may include a vertical stack of silicon germanium alloy nanowires, wherein a germanium content of each silicon germanium alloy nanowire of the vertical stack increases from bottom to top, and wherein a silicon pillar portion is located beneath end segments of each silicon germanium alloy nanowire of the nanowire stack.

In another embodiment, a semiconductor structure is provided that includes a first vertical stack of three silicon germanium alloy nanowires and in a first device region, wherein a germanium content of each of the three silicon germanium alloy nanowires in the first vertical stack increases from bottom to top, and wherein a silicon pillar portion is located beneath end segments of each silicon germanium alloy nanowire of the first vertical stack. A second vertical stack of two silicon germanium alloy nanowires is present in a second device region, wherein a germanium content of each of the two silicon germanium alloy nanowires in the second vertical stack increases from bottom to top, and wherein a silicon pillar portion is located beneath end segments of each silicon germanium alloy nanowire in the second vertical stack. A silicon germanium alloy nanowire is located in a third device region, wherein a silicon pillar portion is located beneath end segments of the silicon germanium alloy nanowire in the third device region, wherein the bottommost silicon germanium alloy nanowire of the first and second vertical stacks has a same germanium content as the silicon germanium alloy nanowire in the third device region, and the second silicon germanium alloy nanowire of the first and second vertical stacks have a same germanium content that is greater than the first germanium content, and the third silicon germanium alloy nanowire of the first vertical stack has a germanium content that is greater than the second silicon germanium alloy nanowire of the first and second vertical stacks and the silicon germanium alloy nanowire in the third device region.

BRIEF DESCRIPTION OF SEVERAL VIEWS OF THE DRAWINGS

FIG. 10A is a cross sectional view of the exemplary semiconductor structure of FIG. 9A after performing a second oxidation which further increases the germanium content in the remaining portion of the topmost layer of silicon germanium alloy from the second germanium content to a third germanium content, while increasing the germanium content in the middle silicon germanium alloy portion from the first germanium content to a fourth germanium content.

FIG. 10B is a cross sectional view perpendicular to the fin structure shown in FIG. 10A illustrating the embodiment of the present application in which the fin structure has vertical sidewalls.

FIG. 10C is a cross sectional view perpendicular to the fin structure of FIG. 10A and of the alternative embodiment of the present application in which the fin structure that is provided has tapered sidewalls.

FIG. 11A is a cross sectional view of the exemplary semiconductor structure of FIG. 10A after removing the surface oxide that formed on the exposed surfaces of the remaining portion of the topmost and middle silicon germanium alloy portions.

FIG. 11B is a cross sectional view perpendicular to the fin structure shown in FIG. 11A illustrating the embodiment of the present application in which the fin has vertical sidewalls.

FIG. 11C is a cross sectional view perpendicular to the fin structure of FIG. 11A and of the alternative embodiment of the present application in which the fin structure that is provided has tapered sidewalls.

FIG. 12A is a cross sectional view of the exemplary semiconductor structure of FIG. 11A after recessing a lower portion of the oxygen impermeable structure to expose the bottommost silicon germanium alloy portion of the fin structure.

FIG. 12B is a cross sectional view perpendicular to the fin structure shown in FIG. 12A illustrating the embodiment of the present application in which the fin has vertical sidewalls.

FIG. 12C is a cross sectional view perpendicular to the fin structure of FIG. 12A and of the alternative embodiment of the present application in which the fin structure that is provided has tapered sidewalls.

DETAILED DESCRIPTION

Figure 1:
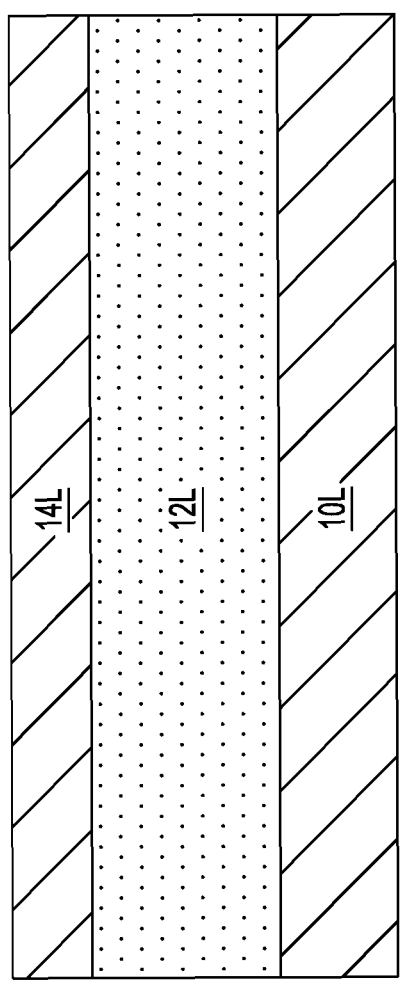
FIG. 1 is a cross sectional view of an exemplary semiconductor structure including from bottom to top, a handle substrate, an insulator layer and a silicon layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including from bottom to top, a handle substrate 10L, an insulator layer 12L and a silicon layer 14L. Collectively, the handle substrate 10L, the insulator layer 12L and the silicon layer 14L can be referred to herein as a silicon-on-insulator substrate.

In some embodiments, handle substrate 10L can be omitted. In other embodiments, handle substrate 10L and insulator layer 12L can be both omitted. In such an embodiment in which the handle substrate 10L and the insulator layer 12L are both omitted, the exemplary structure of FIG. 1 may be a bulk silicon substrate that is entirely composed of silicon layer 14L.

In one embodiment, the handle substrate 10L may include at least one semiconductor material that has semiconducting properties. Examples of materials that have semiconducting properties and thus can be employed as the semiconductor material that provides the handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the handle substrate 10L is composed entirely of silicon.

In another embodiment of the present application, the handle substrate 10L may be composed of a non-semiconductor material including, for example, a dielectric material and/or a conductive material.

When the handle substrate 10L is composed of at least one semiconductor material, the at least one semiconductor material that provides the handle substrate 10L may be single crystalline, polycrystalline or amorphous. In one example, the handle substrate 10L is composed of single crystalline silicon. When the handle substrate 10L is composed of at least one semiconductor material, the at least one semiconductor material that provides the handle substrate 10L may have any of the well known crystal orientations. For example, the crystal orientation of the handle substrate 10L may be {100}, {110}, or {111}. Other crystallographic orientations besides those specifically mentioned can also be used in the present application.

The insulator layer 12L of the exemplary semiconductor structure shown in FIG. 1 may be a crystalline or non-crystalline dielectric material such as an oxide and/or nitride. In one embodiment, the insulator layer 12L is a dielectric oxide such as, for example, silicon dioxide. In another embodiment of the present application, the insulator layer 12L may be a dielectric nitride such as, for example, silicon nitride or boron nitride. In yet another embodiment of the present application, the insulator layer 12L may include a stack of a dielectric oxide and a dielectric nitride. In one example, a stack of, in any order, silicon dioxide and silicon nitride or boron nitride may be employed as the insulator layer 12L. The insulator layer 12L may have a thickness from 10 nm to 200 nm, although other thicknesses that are lesser than, or greater than, the aforementioned thickness range may also be employed as the thickness of the insulator layer 12L.

Silicon layer 14L is typically single crystalline silicon. Silicon layer 14L may have one of the crystal orientations mentioned above for the handle substrate 10L. In one embodiment, the crystal orientation of the silicon 14L and the handle substrate 10L are the same. In another embodiment, the crystal orientation of the silicon layer 14L differs from the handle substrate 10L. In some embodiments, the silicon layer 14L may have a thickness from 20 nm to 200 nm. Other thicknesses that are lesser than, or greater than, the aforementioned thickness range may also be employed as the thickness of the silicon layer 14L.

The SOI substrate (10L, 12L, 14L) may be formed by wafer bonding. In yet another embodiment, the SOI substrate (10L, 12L, 14L) may be formed by an implantation process known as SIMOX (i.e., Separation by IMplanting OXygen).

When a bulk silicon substrate is used, shallow trench isolation structures can be formed into the bulk silicon substrate to define various device regions including, for example, n-FET device regions and/or p-FET device regions. The shallow trench isolation structures can be formed by forming a trench within the bulk silicon substrate and thereafter filling the trench with a trench dielectric material such as, for example, a trench oxide. A planarization process such as, for example, chemical mechanical polishing and/or grinding, may follow the trench fill.

In the drawings that following, the handle substrate 10L that is located beneath the insulator layer 12L is omitted for clarity.

Figure 2:
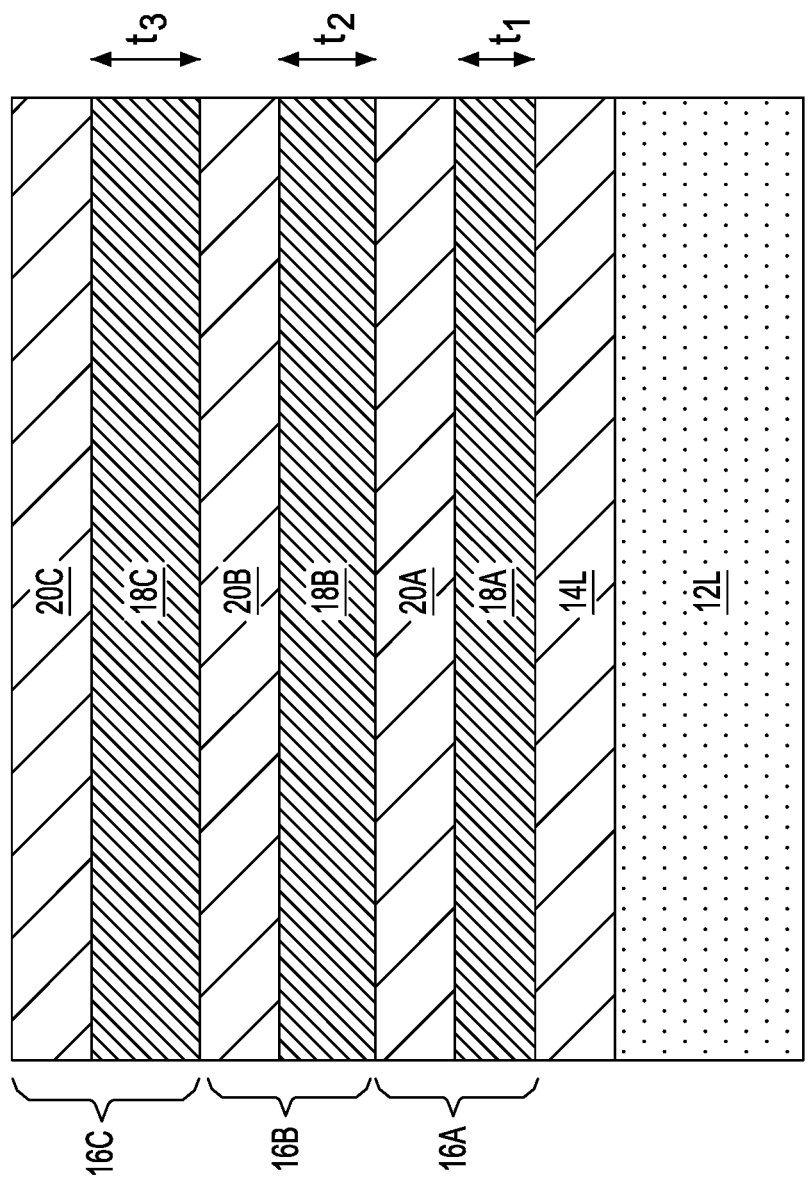
FIG. 2 is a cross sectional view of the exemplary semiconductor structure of FIG. 1 after forming a multilayered stack of heterostructures on the silicon layer, wherein each heterostructure contains, from bottom to top, a layer of a silicon germanium alloy of a first germanium content and a layer of silicon; in the illustrated embodiment, the multilayered stack includes, from bottom to top, a first heterostructure, a second heterostructure and a third heterostructure.

Referring now to FIG. 2, there is illustrated the exemplary semiconductor structure of FIG. 1 after forming a multilayered stack of heterostructures (e.g., 16A, 16B, 16C) on the silicon layer 14L. In accordance with the present application, each heterostructure (e.g., 16A, 16B, 16C) contains, from bottom to top, a layer of a silicon germanium alloy (e.g., 18A, 18B, 18C) of a first germanium content and a layer of silicon (e.g., 20A, 20B, 20C). In accordance with the present application, the thickness of the silicon germanium alloy layer (e.g., 18A, 18B, 18C) of each heterostructure within the multilayered stack increases from bottom to top.

In the illustrated embodiment, the multilayered stack of heterostructures includes, from bottom to top, a first heterostructure 16A, a second heterostructure 16B and a third heterostructure 16C. The number of heterostructures in the multilayered stack is not limited to three. Instead, the multilayered stack of heterostructures may contain as few as two heterostructures stacked one atop the other, or any number of heterostructures greater than three stacked one atop the other.

In the illustrated embodiment, the first heterostructure 16A includes, from bottom to top, a first silicon germanium alloy layer 18A of the first germanium content and a first thickness, $t_1$, and a first silicon layer 20A. The second heterostructure 16B includes, from bottom to top, a second silicon germanium alloy layer 18B of the first germanium content and a second thickness, $t_2$, and a second silicon layer 20B. The third heterostructure 16C includes, from bottom to top, a third silicon germanium alloy layer 18C of the first germanium content and a third thickness, $t_3$, and a third silicon layer 20C. In accordance with the present application and for the illustrated embodiment, $t_1 < t_2 < t_3$. In one example, $t_1$ can be a thickness from 5 nm to 15 nm, $t_2$ can be a thickness from 10 nm to 20 nm, and $t_3$ can be a thickness from 12 nm to 30 nm.

The thickness of each layer of silicon (e.g., 20A, 20B, 20C) may be the same or different. In one embodiment, the thickness each layer of silicon (e.g., 20A, 20B, 20C) may be in a range from 5 nm to 30 nm. Other thicknesses that are lesser than, or greater than, the aforementioned thickness range may also be used as the thickness of each layer of silicon (e.g., 20A, 20B, 20C) within each heterostructure (e.g., 16A, 16B, 16C).

As mentioned above each layer of silicon germanium alloy (e.g., 18A, 18B, 18C) within the multilayered stack of heterostructures has a first germanium content. In one embodiment, the first germanium content of each layer of silicon germanium alloy (e.g., 18A, 18B, 18C) can be from 15 atomic percent germanium to 25 atomic percent germanium.

Although the illustrated embodiment shows a single first heterostructure 16A, the present application contemplates embodiments in which multiple first heterostructures (i.e., first heterostructure sub-units) are stacked one atop the other. In such an embodiment, each layer of silicon germanium alloy with each first heterostructure sub-unit has the first germanium content and the first thickness. Also, and although the illustrated embodiment shows a single second heterostructure 16B, the present application contemplates embodiments in which multiple second heterostructures (i.e., second heterostructure sub-units) are stacked one atop the other. In such an embodiment, each layer of silicon germanium alloy with each second heterostructure sub-unit has the first germanium content and the second thickness. Moreover, and although the illustrated embodiment shows a single third heterostructure 16C, the present application contemplates embodiments in which multiple third heterostructures (i.e., third heterostructure sub-units) are stacked one atop the other. In such an embodiment, each layer of silicon germanium alloy with each third heterostructure sub-unit has the first germanium content and the third thickness.

Each layer of silicon germanium alloy and each layer of silicon within each heterostructure (or each heterostructure sub-unit) can be formed by utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In the present application, each layer within each heterostructure (16A, 16B, 16C) has a same crystalline characteristic as the silicon layer 14L.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each layer of silicon germanium alloy (e.g., 18A, 18B, 18C) can be performed utilizing any well known silicon germanium alloy forming precursor gas or gas mixture. The epitaxial growth of each layer of silicon (e.g., 20A, 20B, 20C) can be performed utilizing any well known silicon forming precursor gas. Carrier gases like hydrogen, nitrogen, helium and argon can be used.

Figure 3:
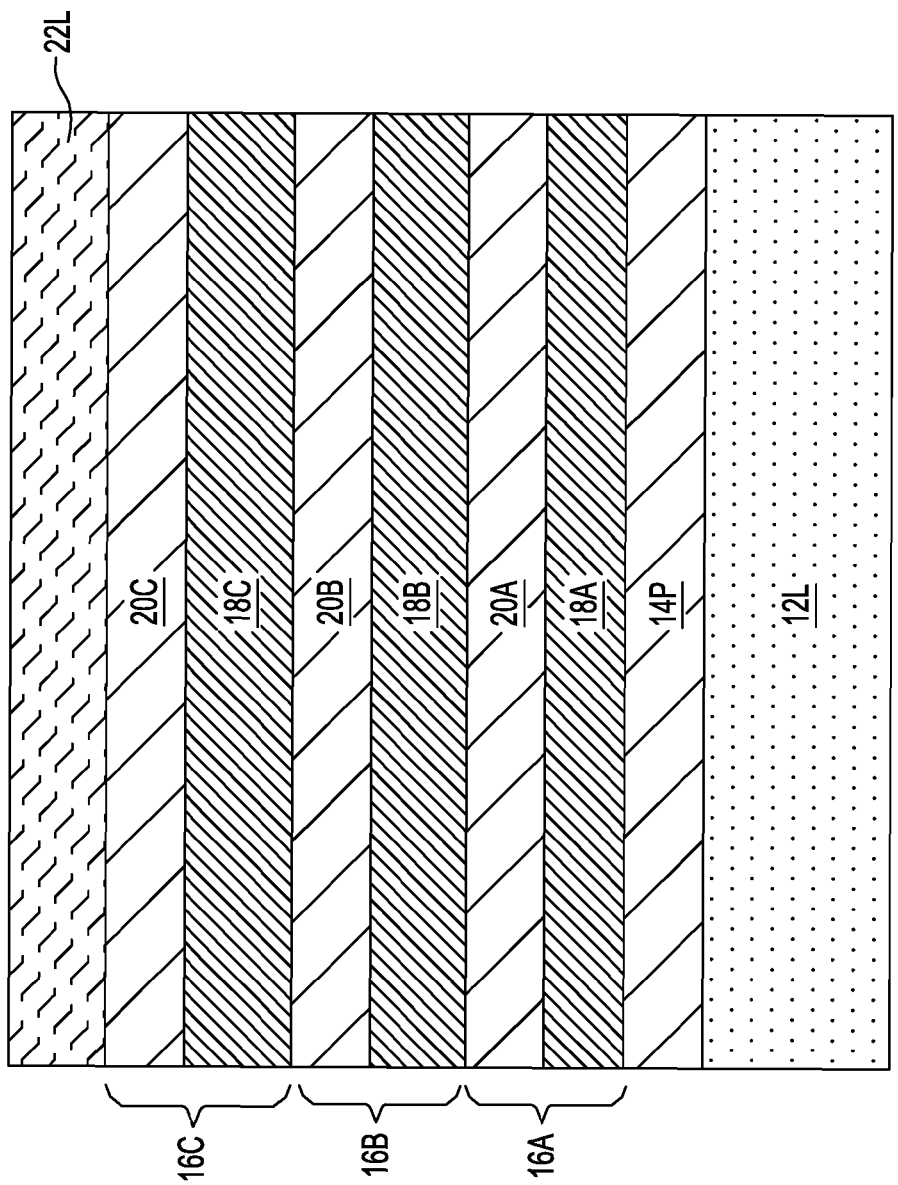
FIG. 3 is a cross sectional view of the exemplary semiconductor structure of FIG. 2 after forming a hard mask layer on the topmost heterostructure of the multilayered stack of hetero structures.

Referring now to FIG. 3, there is illustrated the exemplary semiconductor structure of FIG. 2 after forming a hard mask layer 22L on the topmost heterostructure (e.g., 16C) of the multilayered stack of heterostructures. In the illustrated embodiment, the hard mask layer 22L is formed directly on the third silicon layer 20C of the third heterostructure 16C.

The hard mask layer 22L may include any hard mask material such as, for example, silicon dioxide, silicon nitride, and/or silicon oxynitride. The hard mask material that provides the hard mask layer 22L can be formed utilizing a deposition process such as, for example, chemical vapor deposition or plasma enhanced chemical vapor deposition. The hard mask material that provides the hard mask layer 22L can have a thickness from 5 nm to 20 nm. Other thicknesses that are lesser than, or greater than, the aforementioned thickness range can also be employed as the thickness of the hard mask material that provides the hard mask layer 22L.

Figure 4A:
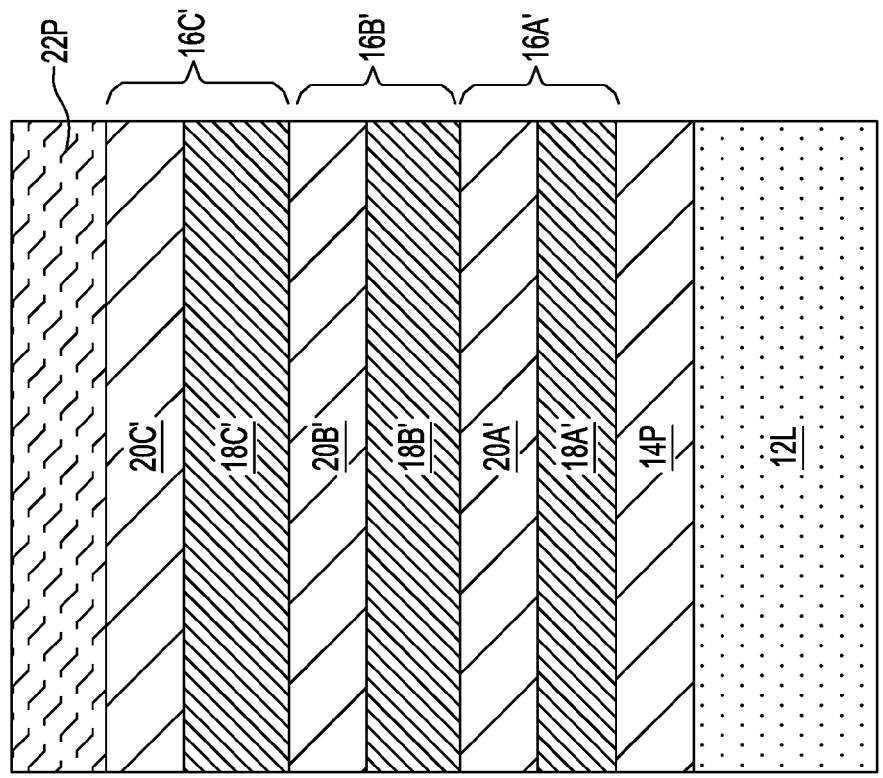
FIG. 4A is a cross sectional view of the exemplary semiconductor structure of FIG. 3 after performing a patterning process to provide a fin structure containing from bottom to top, a silicon base portion, a plurality of heterostructure portions, and a hard mask portion, wherein each heterostructure portion contains, from bottom to top, a silicon germanium alloy portion of the first germanium content and a silicon portion.
Figure 4B:
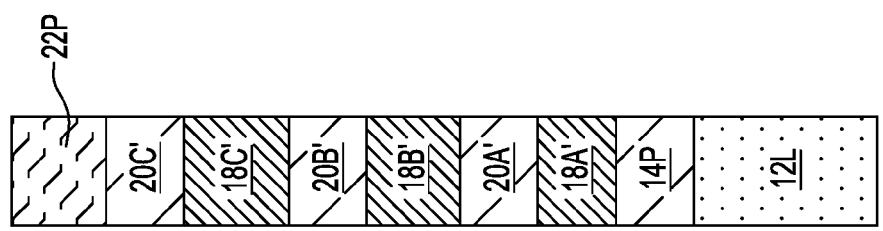
FIG. 4B is a cross sectional view perpendicular to the fin structure shown in FIG. 4A illustrating an embodiment of the present application in which the fin structure has vertical sidewalls.

Referring now to FIGS. 4A-4B, there are illustrated the exemplary semiconductor structure of FIG. 3 after performing a patterning process to provide a fin structure containing from bottom to top, a silicon base portion 14P, a plurality of heterostructure portions (e.g., 16A', 16B', 16C'), and a hard mask portion 22P, wherein each heterostructure portion (e.g., 16A', 16B', 16C') contains, from bottom to top, a silicon germanium alloy portion (e.g., 18A', 18B', 18C') and a silicon portion (20A', 20B', 20C'). It is noted that the insulator layer 12L is not etched by the patterning step; the drawings from now on only illustrates a portion of the insulator layer 12L for clarity. Although a single fin structure is described and illustrated, the present application contemplates embodiments in which a plurality of fin structures (each spaced apart from each other and orientated parallel to each other) are formed on different portions of the insulator layer 12L. These different portions may form different device regions.

In one embodiment of the present application, the patterning used to provide the fin structure may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. In some embodiments, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops on the topmost surface of the insulator layer 12L.

In another embodiment of the present application, the patterning used to provide the fin structure may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. The etch stops on a topmost surface of the insulator layer 12L. Upon completion of the pattern transfer, the SIT process concludes by removing the spacers from the structure. Each spacer may be removed by etching or a planarization process.

In the embodiment illustrated in FIG. 4B, the fin structure has vertical sidewalls such that each material portion of the fin structure (e.g., 14P, 16A', 16B', 16C', 22P) has a same width. In one embodiment of the present application, the width of each material portion of the fin structure (e.g., 14P, 16A', 16B', 16C', 22P) is from 5 nm to 20 nm.

Figure 4C:
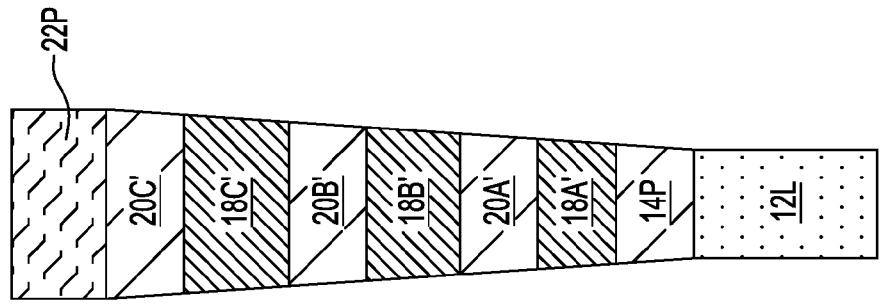
FIG. 4C is a cross sectional view perpendicular to the fin structure of FIG. 4A and of an alternative embodiment of the present application in which the fin structure that is provided has tapered sidewalls.

In an alternative embodiment of the present application and as shown in FIG. 4C, the patterning process can provide a fin structure (e.g., 14P, 16A', 16B', 16C', 22P) that has tapered sidewalls, wherein the tapering gradually increases from a bottom portion of the fin structure. In such an embodiment, each silicon germanium alloy portion (e.g., 18A', 18B', 18C') and each silicon portion (e.g., 20A', 20B', 20C') has a different width. Notably, first silicon germanium alloy portion 18A' has a first width, $w_1$, second silicon germanium alloy portion 18B' has a second width, $w_2$, and third silicon germanium alloy portion 18C' has a third width, $w_3$, wherein $w_1 < w_2 < w_3$. Also, first silicon germanium alloy portion 18A' has the first thickness, $t_1$, second silicon germanium alloy portion 18B' has the second thickness, $t_2$, and third silicon germanium alloy portion 18C' has the third thickness, $t_3$, wherein $t_1 < t_2 < t_3$.

Figure 5C:
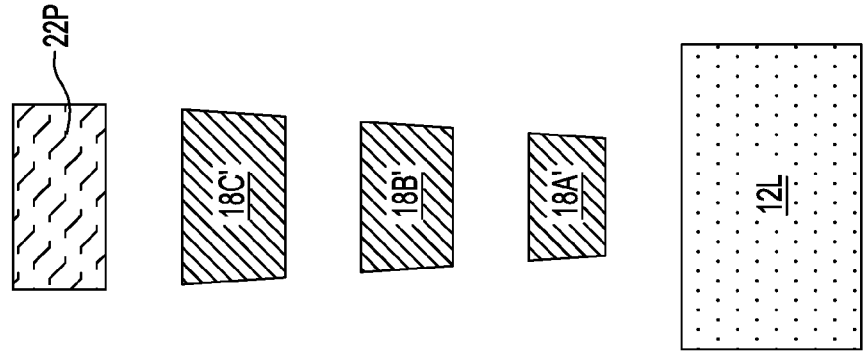
FIG. 5C is a cross sectional view perpendicular to the fin structure of FIG. 5A and of the alternative embodiment of the present application in which the fin structure that is provided has tapered sidewalls.
Figure 5B:
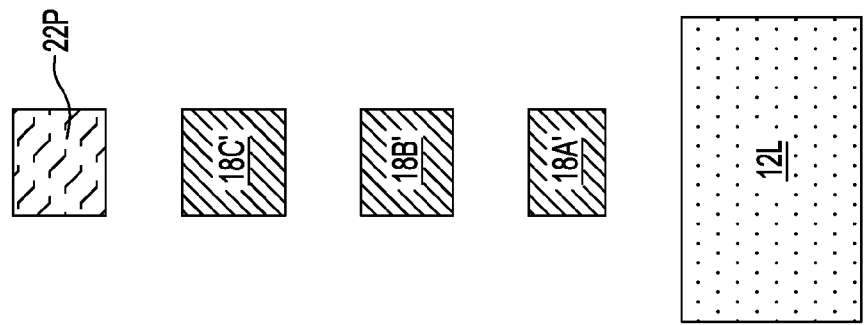
FIG. 5B is a cross sectional view perpendicular to the fin structure shown in FIG. 5A illustrating the embodiment of the present application in which the fin structure has vertical sidewalls.
Figure 5A:
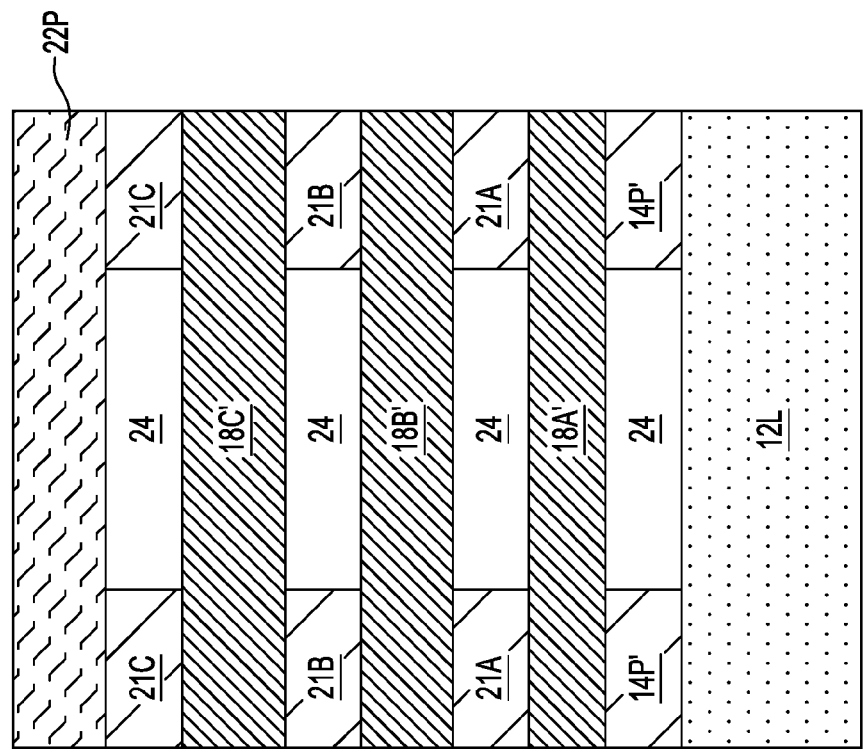
FIG. 5A is a cross sectional view of the exemplary semiconductor structure of FIG. 4A after suspending a middle segment of each silicon germanium alloy portion of the fin structure.

Referring now to FIGS. 5A-5B, there are shown the exemplary semiconductor structure of FIGS. 4A-4B after suspending a middle segment of each silicon germanium alloy portion (e.g., 18A', 18B', 18C') of the fin structure. FIG. 5C shows the fin structure of the alternative embodiment of the present application and after the suspending the middle segment of each silicon germanium alloy portion of the fin structure having tapered sidewalls.

The suspending is obtained by performing an etching process that is selective in removing silicon as compared to a silicon germanium alloy. In one example, the etching process that can be used to suspend the middle segment of each silicon germanium alloy portion (e.g., 18A', 18B', 18C') of the fin structure may include a wet etch process using, for example, tetramethylammonium hydroxide (TMAH) as an etchant. Gap 24 is located beneath each suspended middle segment of each silicon germanium alloy portion (e.g., 18A', 18B', 18C').

As is shown in FIG. 5A, end portions of each silicon germanium alloy portion (e.g., 18A', 18B', 18C') of the fin structure are sandwiched between silicon pillar portions (e.g., 14P'. 21A, 21B, 21C). Each silicon pillar portion 14P' constitutes a remaining portion of the silicon base portion 14P, each silicon pillar portion 21A constitutes a remaining portion of the first silicon portion 20A', each silicon pillar portion 21B constitutes a remaining portion of the second silicon portion 20B', and each silicon pillar portion 21C constitutes a remaining portion of the third portion 20C'.

Figure 6C:
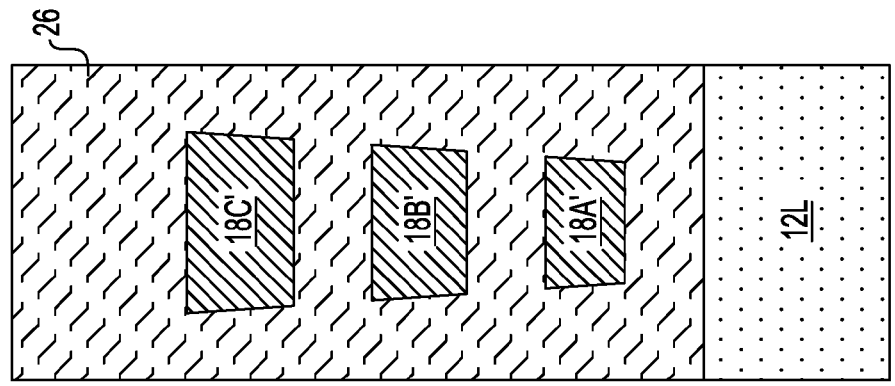
FIG. 6C is a cross sectional view perpendicular to the fin structure of FIG. 6A and of the alternative embodiment of the present application in which the fin structure that is provided has tapered sidewalls.
Figure 6B:
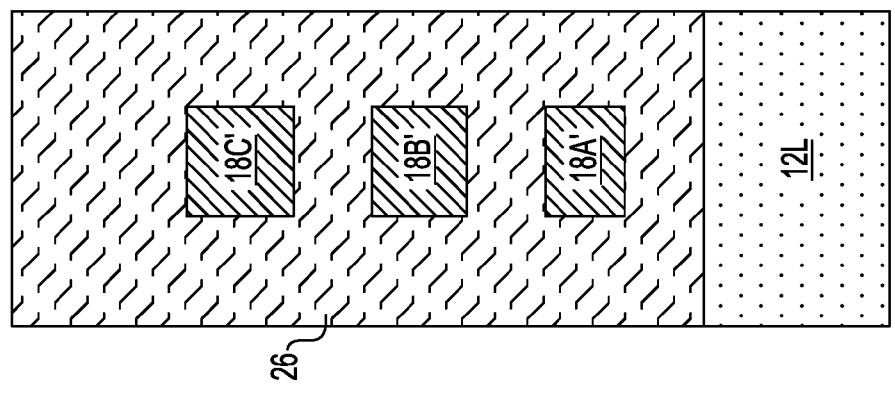
FIG. 6B is a cross sectional view perpendicular to the fin structure shown in FIG. 6A illustrating the embodiment of the present application in which the fin structure has vertical sidewalls.
Figure 6A:
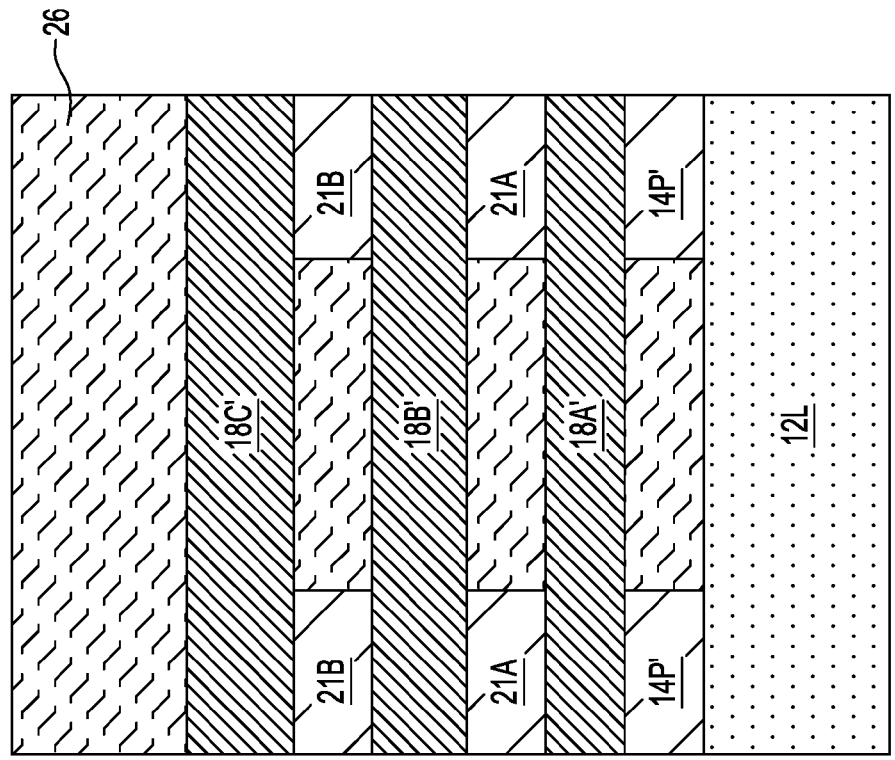
FIG. 6A is a cross sectional view of the exemplary semiconductor structure of FIG. 5A after removing the hard mask portion and the topmost silicon portion of the fin structure, and forming an oxygen impermeable structure.

Referring now to FIGS. 6A-6B, there are shown the exemplary semiconductor structure of FIGS. 5A-5B after removing the hard mask portion 20P and the remaining topmost silicon portion of the fin structure (i.e., the third silicon pillar portion 21C), and forming an oxygen impermeable structure 26. FIG. 6C shows the fin structure of the alternative embodiment of the present application and after the aforementioned steps (i.e., after removing the hard mask portion 20P and the remaining topmost silicon portion of the fin structure (i.e., the third silicon pillar portion 21C), and forming the oxygen impermeable structure 26) have been performed.

In one embodiment, the removal of the hard mask portion 20P and the remaining topmost silicon portion of the fin structure (i.e., the third silicon pillar portion 21C) can be performed simultaneously utilizing a planarization process such as, for example, chemical mechanical polishing (CMP). In another embodiment, the removal of the hard mask portion 20P can be performed utilizing a first removal process, and the removal of the remaining topmost silicon portion of the fin structure (i.e., the third silicon pillar portion 21C) can be performed utilizing a second removal process which may different from the first removal process. In one example, the first removal process may include a first etch back or CMP process, while the second removal process may include a second etch back or CMP process.

As is shown, oxygen impermeable structure 26 completely fills each gap 24 and an upper portion of the oxygen impermeable structure 26 extends atop the exposed surface of the topmost silicon germanium alloy portion (e.g., the third silicon germanium alloy portion 18C') of the fin structure. By "oxygen impermeable" it is meant a material such as silicon nitride in which oxygen does not readily diffuse there through. The oxygen impermeable structure 26 can be formed by depositing an oxygen impermeable material. In some embodiments, and following the deposition of the oxygen impermeable material, a planarization process such as, for example, chemical mechanical polishing (CMP) may be employed.

Figure 7C:
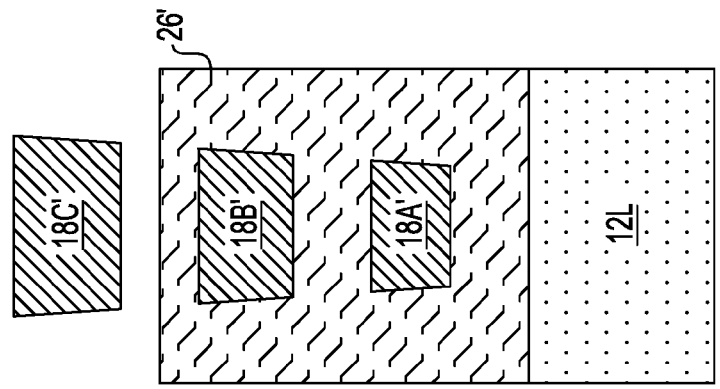
FIG. 7C is a cross sectional view perpendicular to the fin structure of FIG. 7A and of the alternative embodiment of the present application in which the fin structure that is provided has tapered sidewalls.
Figure 7B:
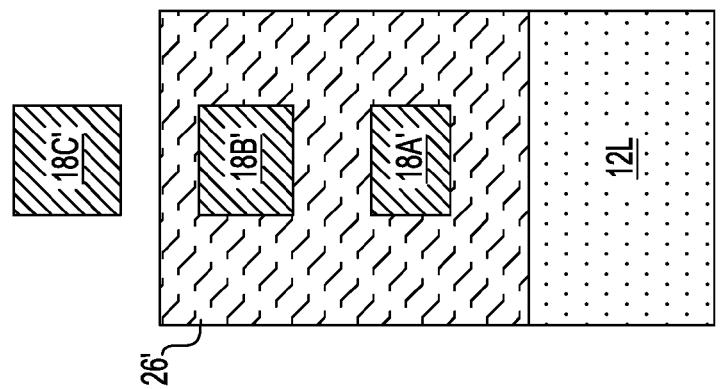
FIG. 7B is a cross sectional view perpendicular to the fin structure shown in FIG. 7A illustrating the embodiment of the present application in which the fin structure has vertical sidewalls.
Figure 7A:
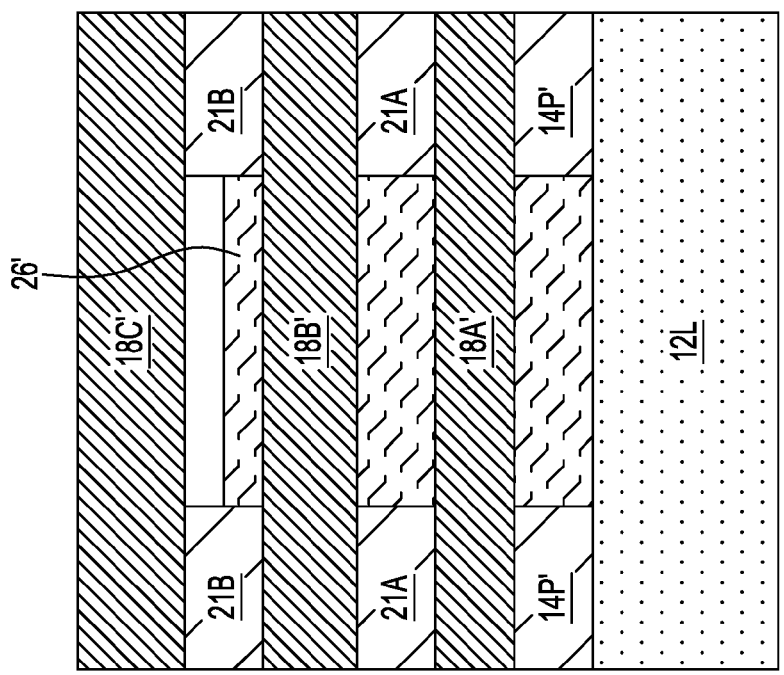
FIG. 7A is a cross sectional view of the exemplary semiconductor structure of FIG. 6A after recessing an upper portion of the oxygen impermeable structure to expose the topmost silicon germanium alloy portion of the fin structure.

Referring now to FIGS. 7A-7B, there are illustrated the exemplary semiconductor structure of FIGS. 6A-6B after recessing an upper portion of the oxygen impermeable structure 26 to expose the topmost silicon germanium alloy portion (e.g., third silicon germanium alloy portion 18C') of the fin structure. FIG. 7C shows the fin structure of the alternative embodiment of the present application and after performing the aforementioned recessing of the oxygen impermeable structure 26.

The recessing of the oxygen impermeable structure 26 provides a first recessed oxygen impermeable structure 26'. The first recessed oxygen impermeable structure 26' has a topmost surface that is located beneath the bottommost surface of the topmost silicon germanium alloy portion (e.g., third silicon germanium alloy portion 18C') of the fin structure, yet above a topmost surface of the next nearest silicon germanium alloy portion (e.g., second silicon germanium alloy portion 18B') of the fin structure.

The recessing of the oxygen impermeable structure 26 can be performed utilizing an etch back process that is selective for removing the oxygen impermeable material that provides the oxygen impermeable structure 26. In one embodiment, and when the oxygen impermeable material that provides the oxygen impermeable structure 26 comprises silicon nitride, hot phosphoric acid can be used.

Figure 8C:
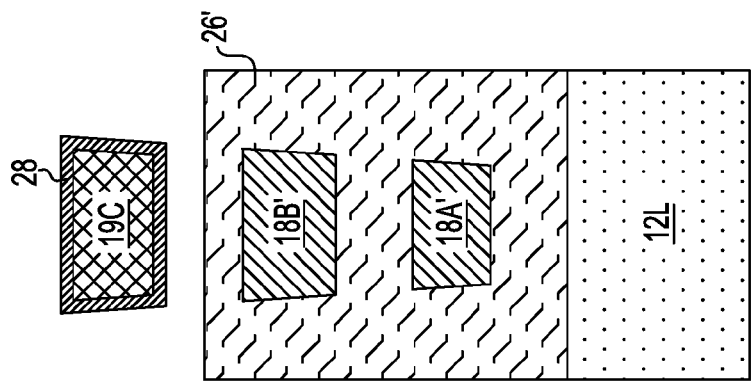
FIG. 8C is a cross sectional view perpendicular to the fin structure of FIG. 8A and of the alternative embodiment of the present application in which the fin structure that is provided has tapered sidewalls.
Figure 8B:
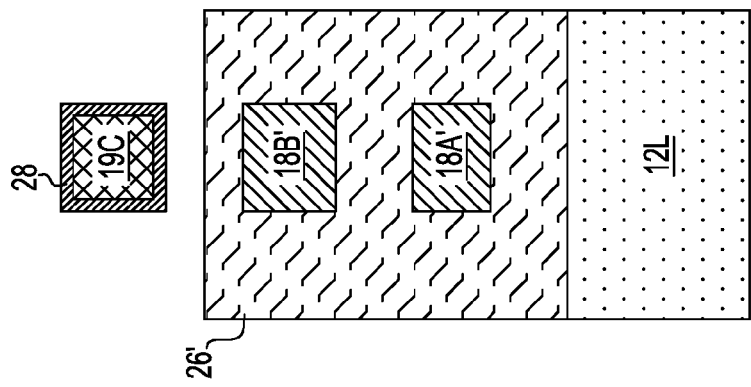
FIG. 8B is a cross sectional view perpendicular to the fin structure shown in FIG. 8A illustrating the embodiment of the present application in which the fin structure has vertical sidewalls.
Figure 8A:
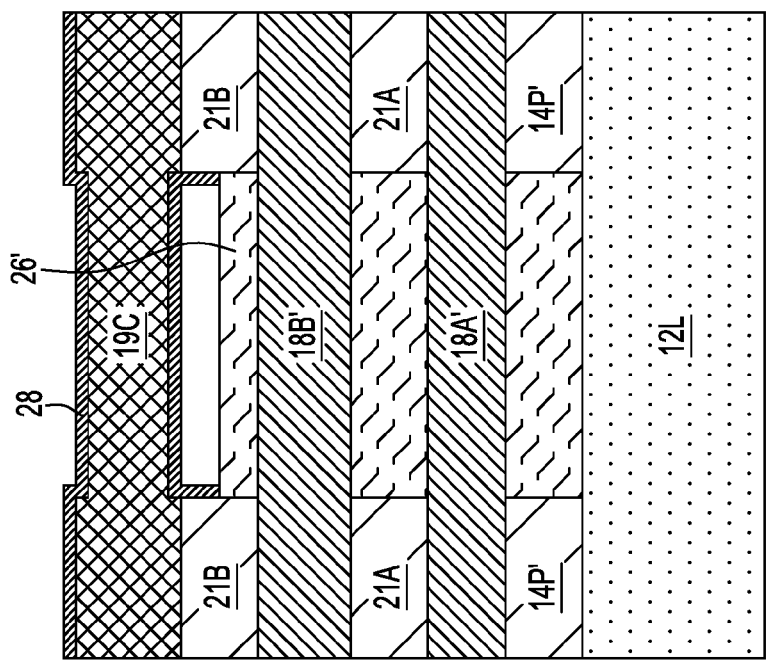
FIG. 8A is a cross sectional view of the exemplary semiconductor structure of FIG. 7A after performing a first oxidation which increases the germanium content in the topmost silicon germanium alloy portion of the fin structure from the first germanium content to a second germanium content.

Referring now to FIGS. 8A-8B, there are shown the exemplary semiconductor structure of FIGS. 7A-7B after performing a first oxidation which increases the germanium content in the topmost silicon germanium alloy portion (i.e., the third silicon germanium alloy portion 18C') of the fin structure from the first germanium content to a second germanium content. FIG. 7C shows the fin structure of the alternative embodiment of the present application and after the first oxidation.

The topmost silicon germanium alloy portion (i.e., the third silicon germanium alloy portion 18C') having the second germanium content that is greater than the first germanium content is hereinafter referred to as a topmost silicon germanium alloy nanowire (i.e., a third silicon germanium alloy nanowire 19C). The topmost silicon germanium alloy nanowire (i.e., the third silicon germanium alloy nanowire 19C) has a thickness that is less than $t_3$ to $t_2$; the non-suspended end segments of the topmost silicon germanium alloy nanowire (i.e., the third silicon germanium alloy nanowire 19C) typically have a thickness that is greater than the thickness of the suspended middle segment of the topmost silicon germanium alloy nanowire (i.e., the third silicon germanium alloy nanowire 19C). The topmost silicon germanium alloy nanowire (i.e., the third silicon germanium alloy nanowire 19C) has a width that is less than $w_3$ to $w_2$. The second germanium content of the topmost silicon germanium alloy nanowire (i.e., the third silicon germanium alloy nanowire 19C) can be from 40 atomic percent germanium to 90 atomic percent germanium.

The first oxidation may be referred to herein as a first thermal condensation process. The first oxidation includes an anneal that is performed in an oxidizing ambient (such as, for example, air, oxygen, ozone and/or $NO_2$). The anneal temperature can be from 600° C. to 1200° C.

During the first oxidation, a surface oxide 28 forms on the exposed surfaces (topmost and bottommost) of the topmost silicon germanium alloy nanowire (i.e., the third silicon germanium alloy nanowire 19C). The surface oxide 28 is a thin oxide that typically has a thickness from 1 nm to 5 nm.

Figure 9C:
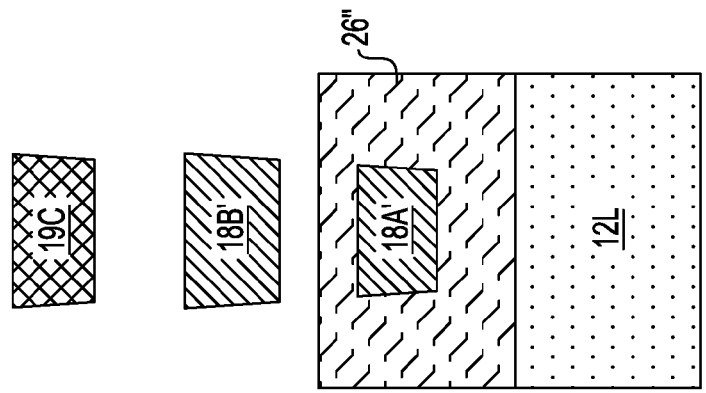
FIG. 9C a cross sectional view perpendicular to the fin structure of FIG. 9A and of the alternative embodiment of the present application in which the fin structure that is provided has tapered sidewalls.
Figure 9B:
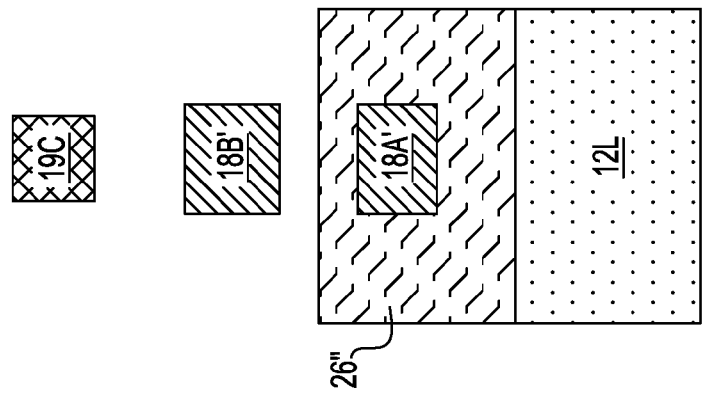
FIG. 9B is a cross sectional view perpendicular to the fin structure shown in FIG. 9A illustrating the embodiment of the present application in which the fin structure has vertical sidewalls.
Figure 9A:
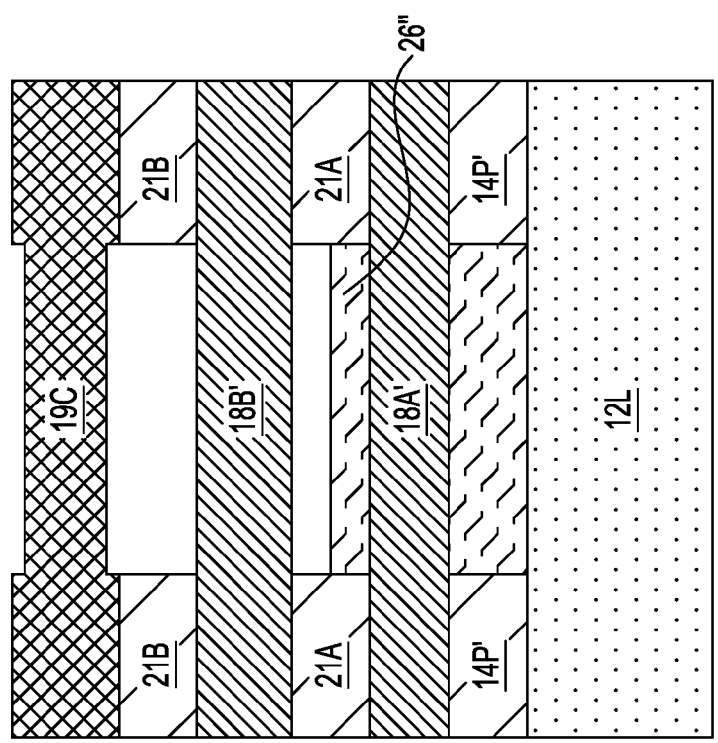
FIG. 9A is a cross sectional view of the exemplary semiconductor structure of FIG. 8A after removing the surface oxide that formed on the exposed surfaces of the topmost silicon germanium alloy portion and recessing a middle portion of the oxygen impermeable structure to expose the middle silicon germanium alloy portion of the first germanium content of the fin structure.

Referring now to FIGS. 9A-9B, there are shown the exemplary semiconductor structure of FIGS. 8A-8B after removing the surface oxide 28 that formed on the exposed surfaces of the topmost silicon germanium alloy portion (i.e., the third silicon germanium alloy nanowire 19C) and recessing a middle portion of the oxygen impermeable structure 26 (i.e., the first recessed oxygen impermeable structure 26') to expose the middle silicon germanium alloy portion (i.e., the second silicon germanium alloy portion 18B') of the first germanium content of the fin structure. FIG. 9C shows the fin structure of the alternative embodiment of the present application and after performing the aforementioned recessing of the oxygen impermeable structure 26.

The removal of the oxide may be performed utilizing any etching process that is selective in removing an oxide. In one example, HF can be used to remove the surface oxide 28.

The recessing of the first recessed oxygen impermeable structure 26' provides a second recessed oxygen impermeable structure 26". The second recessed oxygen impermeable structure 26" has a topmost surface that is located beneath the bottommost surface of the middle silicon germanium alloy portion (e.g., second silicon germanium alloy portion 18B') of the fin structure, yet above a topmost surface of the next nearest silicon germanium alloy portion (e.g., first silicon germanium alloy portion 18A') of the fin structure.

The recessing of the first recessed oxygen impermeable structure 26' can be performed utilizing an etch back process that is selective for removing the oxygen impermeable material that provides the oxygen impermeable structure 26. In one embodiment, and when the oxygen impermeable material that provides the oxygen impermeable structure 26 comprises silicon nitride, hot phosphoric acid can be used.

Referring now to FIGS. 10A-10B, there are shown the exemplary semiconductor structure of FIGS. 9A-9B after performing a second oxidation. The second oxidation further increases the germanium content in the remaining portion of the topmost layer of silicon germanium alloy portion (i.e., the third silicon germanium alloy nanowire 19C) from the second germanium content to a third germanium content, while increasing the germanium content in the middle silicon germanium alloy portion (i.e., second silicon germanium alloy portion 19B) from the first germanium content to a fourth germanium content. The fourth content is greater than the first content, but less than the third content. FIG. 10C shows the fin structure of the alternative embodiment of the present application and after the second oxidation.

The third silicon germanium alloy nanowire 19C having the third germanium content that is greater than the first germanium content is labeled as element 19C' in the drawings. The third silicon germanium alloy nanowire 19C' has a thickness that is less than $t_2$ to $t_1$; the non-suspended end segments of the third silicon germanium alloy nanowire 19C' typically have a thickness that is greater than the thickness of the suspended middle segment of the third silicon germanium alloy nanowire 19C'. The third silicon germanium alloy nanowire 19C' has a width that is less than $w_2$ to $w_1$. The third content of the third silicon germanium alloy nanowire 19C' can be from 30 atomic percent germanium to 80 atomic percent germanium.

The middle germanium alloy portion (i.e., the third silicon germanium alloy portion 18B') having the fourth germanium content that is greater than the first germanium content, but less than the third germanium content, is hereinafter referred to as a middle silicon germanium alloy nanowire (i.e., a second silicon germanium alloy nanowire 19BC). The middle silicon germanium alloy nanowire (i.e., the second silicon germanium alloy nanowire 19B) has a thickness that is less than $t_2$ to $t_1$; the non-suspended end segments of the middle silicon germanium alloy nanowire (i.e., the second silicon germanium alloy nanowire 19B) typically have a thickness that is greater than the thickness of the suspended middle segment of the middle silicon germanium alloy nanowire (i.e., the second silicon germanium alloy nanowire 19BC). The middle silicon germanium alloy nanowire (i.e., the third silicon germanium alloy nanowire 19B) has a width that is less than $w_2$ to $w_1$. The fourth germanium content of the middle silicon germanium alloy nanowire (i.e., the second silicon germanium alloy nanowire 19B) can be from 20 atomic percent germanium to 70 atomic percent germanium.

The second oxidation may be referred to herein as a second thermal condensation process. The second oxidation may be performed utilizing an oxidizing ambient and within a temperature range mentioned above for the first oxidation.

During the first second, a surface oxide 28 forms on the exposed surfaces (topmost and bottommost) of the third silicon germanium alloy nanowire 19C' and the second silicon germanium alloy nanowire 19B. The surface oxide 28 is a thin oxide that typically has a thickness from 1 nm to 5 nm.

Referring now to FIGS. 11A-11B, there are shown the exemplary semiconductor structure of FIG. 10A after removing the surface oxide 28 that formed on the exposed surfaces of the remaining portion of the topmost and middle silicon germanium alloy portions (i.e., the third silicon germanium alloy nanowire 19C' and the second silicon germanium alloy nanowire 19B). FIG. 11C shows the fin structure of the alternative embodiment of the present application and after the removal of the surface oxide. The removal of the oxide may be performed utilizing any etching process that is selective in removing an oxide. In one example, HF can be used to remove the surface oxide 28.

The steps of recessing the oxygen impermeable structure, oxidation and surface oxide removal can be repeated any number of times depending on the number of heterostructures within the original multilayer stack of heterostructures. The bottommost silicon germanium portion of the bottommost heterostructure portion is not subjected to any oxidation.

Referring now to FIGS. 12A-12B, there are shown the exemplary semiconductor structure of FIG. 11A after recessing a lower portion of the oxygen impermeable structure 26 (i.e., the second recessed oxygen impermeable structure 26") to expose the bottommost silicon germanium alloy portion (e.g., the first silicon germanium alloy portion 18A') of the fin structure. FIG. 12C shows the fin structure of the alternative embodiment of the present application and after the recessing step. The recessing of the second recessed oxygen impermeable structure 26" completely removes the oxygen impermeable material from the exemplary semiconductor structure. The recessing of the second recessed oxygen impermeable structure 26" can be performed utilizing an etch back process that is selective for removing the oxygen impermeable material that provides the oxygen impermeable structure 26. In one embodiment, and when the oxygen impermeable material that provides the oxygen impermeable structure 26 comprises silicon nitride, hot phosphoric acid can be used. In the FIGS. 12A-12C and the drawings that following, the first silicon germanium alloy portion 18A is now referred to as a first silicon germanium alloy nanowire 19A. The first silicon germanium alloy nanowire 19A has the first germanium content.

The exemplary semiconductor structure shown in FIGS. 12A-12C can be used for high-performance devices and the threshold voltage is governed by the third silicon germanium alloy nanowire 19C'.

Figure 13B:
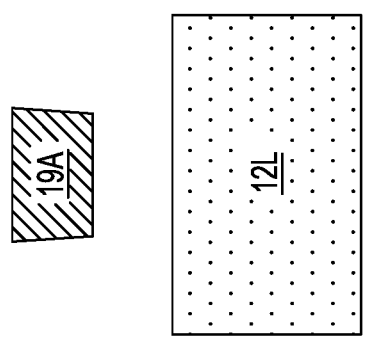
FIG. 13B is a cross sectional view of the exemplary semiconductor structure of FIG. 12C after removing the topmost and middle silicon germanium alloy portions in accordance with one embodiment of the present application.
Figure 13A:
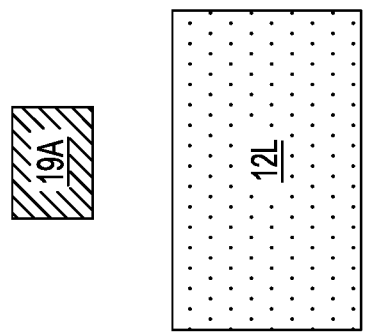
FIG. 13A is a cross sectional view of the exemplary semiconductor structure of FIG. 12B after removing the topmost and middle silicon germanium alloy portions in accordance with one embodiment of the present application.

Referring now to FIG. 13A, there is illustrated the exemplary semiconductor structure of FIG. 12B after removing the topmost and middle silicon germanium alloy portions (i.e., the third and second silicon germanium alloy nanowires 19C', 19B). FIG. 13B illustrates the exemplary semiconductor structure of FIG. 12C after also removing the topmost and middle silicon germanium alloy portions (i.e., the third and second silicon germanium alloy nanowires 19C', 19B). The topmost and middle silicon germanium alloy portions (i.e., the third and second silicon germanium alloy nanowires 19C', 19B) can be removed utilizing a planarization process utilizing the silicon pillars (21B, 21A) as planarization stop layers. The silicon pillars (21B, 21A) can be removed utilizing a selective etch that removes silicon selective to silicon germanium.

The exemplary semiconductor structure shown in FIGS. 13A and 13B can be used for low-power or ultra low-power devices and the threshold voltage is governed by the first silicon germanium alloy nanowire 19A.

Figure 14B:
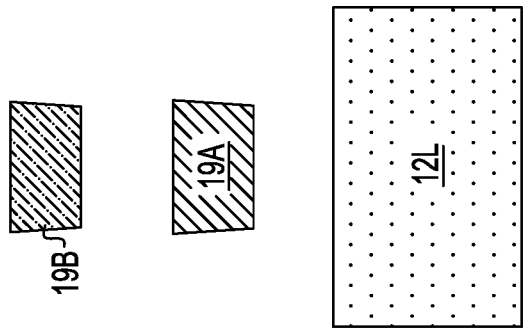
FIG. 14B is a cross sectional view of the exemplary semiconductor structure of FIG. 12C after removing the topmost silicon germanium alloy portion in accordance with one embodiment of the present application.
Figure 14A:
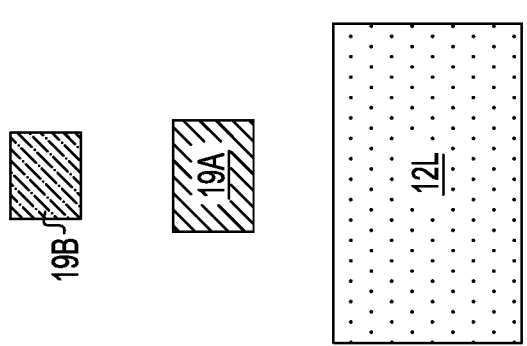
FIG. 14A is a cross sectional view of the exemplary semiconductor structure of FIG. 12B after removing the topmost silicon germanium alloy portion in accordance with one embodiment of the present application.

Referring now to FIG. 14A, there is illustrated the exemplary semiconductor structure of FIG. 12B after removing the topmost silicon germanium alloy portions (i.e., the third silicon germanium alloy nanowire 19C'). FIG. 14B illustrates the exemplary semiconductor structure of FIG. 12C after also removing the topmost silicon germanium alloy portion (i.e., the third silicon germanium alloy nanowire 19C'). The topmost germanium alloy portion (i.e., the third silicon germanium alloy nanowires 19C') can be removed utilizing a planarization process utilizing the silicon pillars 21B as planarization stop layers. The silicon pillars 21B can be removed utilizing a selective etch that removes silicon selective to silicon germanium.

The exemplary semiconductor structure shown in FIGS. 14A and 14B can be used for standard power devices and the threshold voltage is governed by the second silicon germanium alloy nanowire 19A.

In accordance with the present application, it is possible to provide an exemplary semiconductor structure (i.e., system on a chip) that includes a first device region that includes the stack of silicon germanium alloy nanowires shown in FIG. 12B (or FIG. 12C), a second device region that includes the stack of silicon germanium alloy nanowires shown in FIG. 13A (or FIG. 13B), and a third device region that includes the stack of silicon germanium alloy nanowires shown in FIG. 14A (or FIG. 14B), or any subset of stacked silicon germanium alloy nanowires shown in FIGS. 12B, 12C, 13A, 13B, 14A and 14B.

Figure 15:
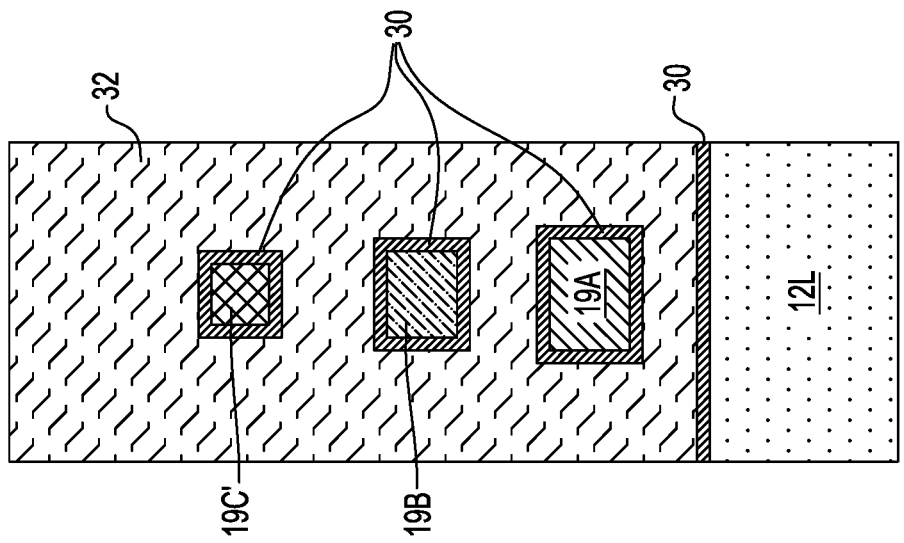
FIG. 15 is a cross sectional view of the exemplary semiconductor structure of FIG. 12B after forming a functional gate structure surrounding each silicon geranium alloy portion in accordance with one embodiment of the present application.

Referring now to FIG. 15, there is illustrated the exemplary semiconductor structure of FIG. 12B after forming a functional gate structure surrounding each silicon geranium alloy portion (i.e., each silicon germanium alloy nanowire 19A, 19B, 19C') in accordance with one embodiment of the present application. By "functional gate structure" it is meant a permanent gate structure used to control output current (i.e., flow of carriers in the channel) of a semiconducting device through electrical or magnetic fields. In an embodiment, the functional gate structure may include a gate dielectric portion 30 and gate conductor portion 32. In one embodiment, the functional gate structure is a component of a pFET.

The gate dielectric portion 30 may include a gate dielectric material. The gate dielectric material that provides the gate dielectric portion 30 can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 30.

The gate dielectric material used in providing the gate dielectric portion 30 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 30 can have a thickness in a range from 1 nm to 10 nm. Other thicknesses that are lesser than, or greater than, the aforementioned thickness range can also be employed for the gate dielectric material that may provide the gate dielectric portion 30.

The gate conductor portion 32 can include a gate conductor material. The gate conductor material used in providing the gate conductor portion 32 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate conductor material used in providing the gate conductor portion 32 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 32 has a thickness from 50 nm to 200 nm. Other thicknesses that are lesser than, or greater than, the aforementioned thickness range can also be employed for the gate conductor material used in providing the gate conductor portion.

Source regions and drain regions can be formed into exposed portions of each silicon germanium nanowire by ion implantation or gas phase doping as is well known to those skilled in the art.

In some embodiments, the structure shown in FIG. 13A and/or the FIG. 14A can lay adjacent the structure shown in FIG. 15. In such an embodiment, a functional gate structure can be formed around each silicon germanium alloy nanowire (e.g., 19A and/or 19B) shown in FIG. 13A and/or the FIG. 14A. The various functional gate structures may include the same or different gate dielectric material and/or gate conductor material. Different gate dielectric materials and/or gate conductor materials can be obtained by utilizing block mask technology.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a vertical stack of silicon germanium alloy nanowires located on a substrate, wherein a germanium content of said vertical stack increases from a bottommost silicon germanium alloy nanowire of said vertical stack to a topmost silicon germanium alloy nanowire of said vertical stack and wherein the germanium content of each silicon germanium alloy nanowire of the vertical stack is different, and wherein a silicon pillar portion is located beneath end segments of each silicon germanium alloy nanowire of said vertical stack, wherein each bottommost silicon portion located beneath said end segments of said bottommost silicon germanium alloy nanowire is in direct physical contact with a surface of said substrate.

2. The semiconductor structure of claim 1, wherein said end segments of each silicon germanium alloy nanowire of said vertical stack have a thickness that is greater than a thickness of a middle segment of each silicon germanium alloy nanowire of said vertical stack.

3. The semiconductor structure of claim 1, wherein each silicon germanium alloy nanowire has vertical sidewalls.

4. The semiconductor structure of claim 1, wherein each silicon germanium alloy nanowire has tapered sidewalls that increases from bottom to top.

5. The semiconductor structure of claim 1, wherein portions of each silicon germanium alloy nanowire of said vertical stack of silicon germanium alloy nanowires located between said end segments are suspended above said substrate, wherein said substrate comprises an insulator layer of a silicon-on-insulator substrate.

6. The semiconductor structure of claim 5, further comprising a functional gate structure surrounding each silicon germanium alloy nanowire of said vertical stack.

7. The semiconductor structure of claim 1, wherein said vertical stack of silicon germanium alloy nanowires comprises, from bottom to top, a first silicon germanium alloy nanowire, a second silicon germanium alloy nanowire, and a third silicon germanium alloy nanowire, wherein said first silicon germanium alloy nanowire comprises said bottommost silicon germanium alloy nanowire of said vertical stack and said third silicon germanium alloy nanowire comprises said topmost silicon germanium alloy nanowire of said vertical stack.

8. The semiconductor structure of claim 7, wherein said third silicon germanium alloy nanowire has a germanium content of 30 atomic percent to 90 atomic percent, said second silicon germanium alloy nanowire has a germanium content that is less than said germanium content of said third silicon germanium alloy nanowire and is from 20 atomic percent to 70 atomic percent, and said first silicon germanium nanowire has a germanium content of less than said germanium content of said second silicon germanium alloy nanowire.

9. The semiconductor structure of claim 1, wherein portions of each silicon germanium alloy nanowire of said vertical stack of silicon germanium alloy nanowires located between said end segments are suspended above said substrate, wherein said substrate is a bulk silicon substrate.

10. The semiconductor structure of claim 9, further comprising a functional gate structure surrounding each silicon germanium alloy nanowire of said vertical stack.

11. A semiconductor structure comprising:
a first vertical stack of three silicon germanium alloy nanowires and in a first device region of a substrate, wherein a germanium content of of said first vertical stack increases from a bottommost silicon germanium alloy nanowire of said first vertical stack to a topmost silicon germanium alloy nanowire of said first vertical stack, and wherein a silicon pillar portion is located beneath end segments of each silicon germanium alloy nanowire in said first vertical stack, wherein each bottommost silicon portion located beneath said end segments of said bottommost silicon germanium alloy nanowire of said first vertical stack is in direct physical contact with a surface of said substrate;
a second vertical stack of two silicon germanium alloy nanowires and in a second device region of said substrate, wherein a germanium content of of said second vertical stack increases from a bottommost silicon germanium alloy nanowire of said second vertical stack to a topmost silicon germanium alloy nanowire of said second vertical stack, and wherein a silicon pillar portion is located beneath end segments of each silicon germanium alloy nanowire in said second vertical stack, wherein each bottommost silicon portion located beneath said end segments of said bottommost silicon germanium alloy nanowire of said second vertical stack is in direct physical contact with a surface of said substrate; and
a silicon germanium alloy nanowire in a third device region of said substrate, wherein a silicon pillar portion is located beneath end segments of said silicon germanium alloy nanowire in said third device region, wherein said bottommost silicon germanium alloy nanowire of said first and second vertical stacks has a same germanium content as said silicon germanium alloy nanowire in said third device region, and a middle silicon germanium alloy nanowire of said first vertical stack and said topmost silicon germanium alloy nanowire of said second vertical stack have a same germanium content that is greater than the first germanium content, and said topmost silicon germanium alloy nanowire of said first vertical stack has a germanium content that is greater than said middle silicon germanium alloy nanowire of said first vertical stack and said topmost silicon germanium alloy nanowire of said second vertical stack and said silicon germanium alloy nanowire in said third device region.

12. The semiconductor structure of claim 11, further comprising a functional gate structure surrounding each silicon germanium alloy nanowire in said first, second and third device regions.

13. The semiconductor structure of claim 11, wherein portions of each silicon germanium alloy nanowire located between said end segments are suspended above said substrate, wherein said substrate comprises an insulator layer of a silicon-on-insulator substrate.

14. The semiconductor structure of claim 11, wherein portions of each silicon germanium alloy nanowire located between said end segments are suspended above said substrate, wherein said substrate is a bulk silicon substrate.

15. The semiconductor structure of claim 11, wherein each silicon germanium alloy nanowire has vertical sidewalls.

16. The semiconductor structure of claim 11, wherein each silicon germanium alloy nanowire has tapered sidewalls that increases from bottom to top.

* * * * *